United States Patent
Kohara

(10) Patent No.: US 7,460,421 B2
(45) Date of Patent: Dec. 2, 2008

(54) SEMICONDUCTOR INTEGRATED CIRCUIT DEVICE

(75) Inventor: Koji Kohara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 11/623,602

(22) Filed: Jan. 16, 2007

(65) Prior Publication Data

US 2007/0165467 A1 Jul. 19, 2007

(30) Foreign Application Priority Data

Jan. 18, 2006 (JP) ............... 2006-010082

(51) Int. Cl.
*G11C 11/00* (2006.01)
(52) U.S. Cl. .................. 365/200; 365/230.06
(58) Field of Classification Search ................ 365/200, 365/230.06
See application file for complete search history.

(56) References Cited

U.S. PATENT DOCUMENTS

| 5,430,679 | A * | 7/1995 | Hiltebeitel et al. .......... 365/200 |
| 6,804,156 | B2 | 10/2004 | Ito |
| 6,937,533 | B2 | 8/2005 | Hojo et al. |
| 2003/0106001 | A1 * | 6/2003 | Kurumada et al. .......... 714/718 |
| 2004/0066684 | A1 * | 4/2004 | Ito .............................. 365/201 |
| 2006/0083085 | A1 * | 4/2006 | Ikegami ...................... 365/200 |
| 2006/0161744 | A1 * | 7/2006 | Fukuda ....................... 711/154 |

FOREIGN PATENT DOCUMENTS

JP 2004-133970 4/2004

OTHER PUBLICATIONS

Ouellette et al, Shared Fuse Macro for Multiple Embedded Memory Devices with Redundancy, Proceedings of the IEEE 2001 Custom Integrated Circuits Conference, 2002, pp. 191-194.

* cited by examiner

*Primary Examiner*—Michael T Tran
(74) *Attorney, Agent, or Firm*—Amin, Turocy & Calvin, LLP

(57) ABSTRACT

There is disclosed a semiconductor integrated circuit comprising a plurality of memory macros each including a redundancy cell, each of the memory macros being assigned with an address and transferred with data of a defect address of a semiconductor memory and store the data of the defect address, a plurality of non-volatile memory elements less in number than the plurality of memory macros, each of which stores redundancy data to be transferred to a memory macro and address data showing the memory macro as a transfer destination of the redundancy data in a form of set, and a transfer control circuit which transfers the redundancy data to the memory macro as the transfer destination from the non-volatile memory elements in accordance with the address data showing the memory macro as the transfer destination.

20 Claims, 8 Drawing Sheets

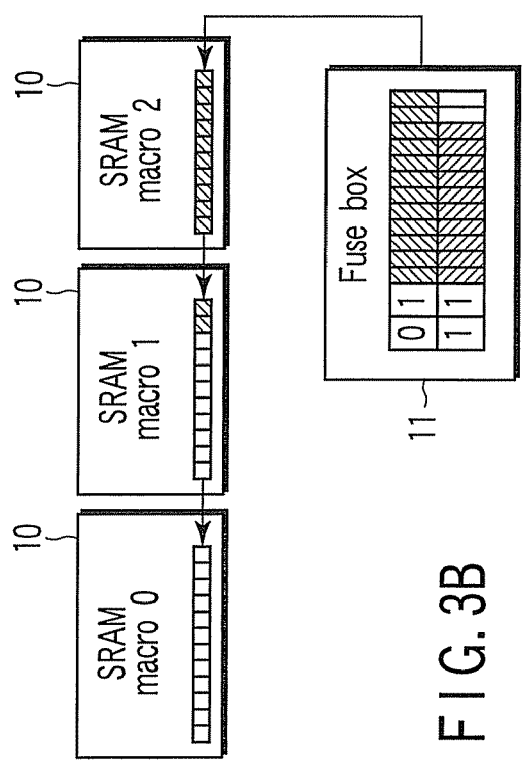
F I G. 3A
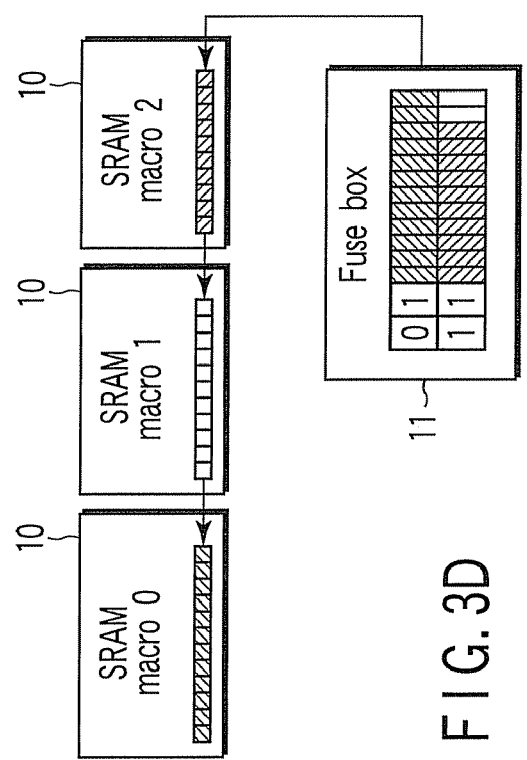
F I G. 3B
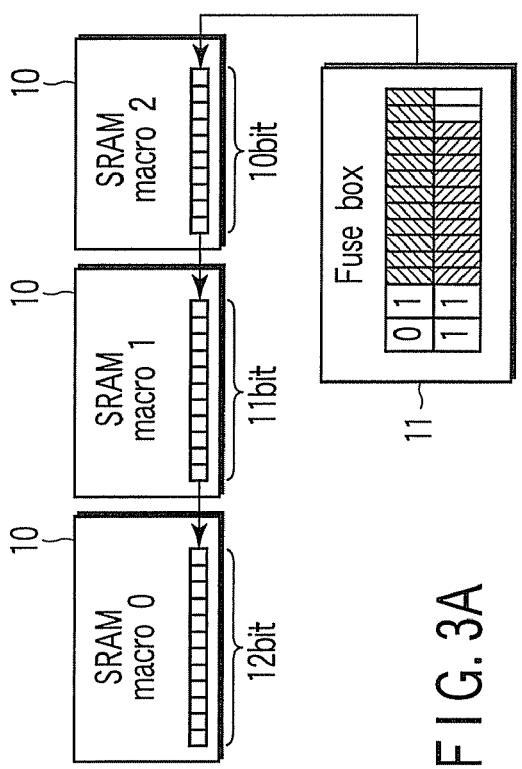
F I G. 3C
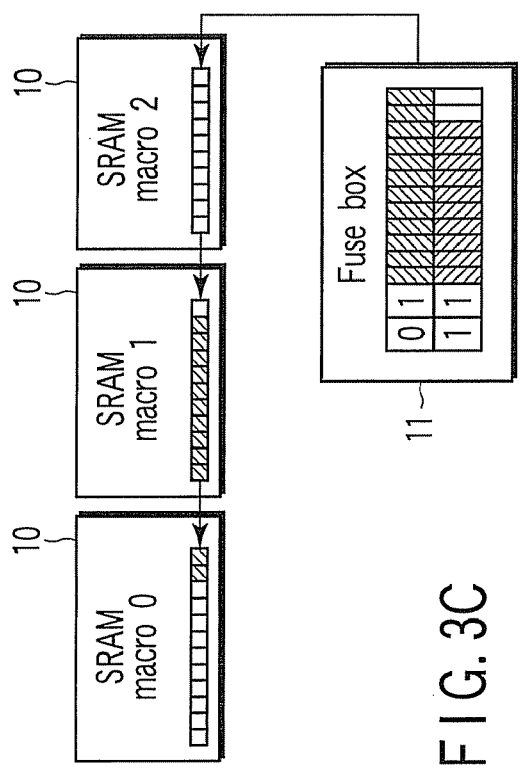
F I G. 3D

| m | Calculating expression | Probability | Accumulated probability | Number of fuses |
|---|---|---|---|---|
| 16 | $p^{16}$ | 0.000% | 0.000% | 512 |
| 15 | $_{16}C_{15} \cdot p^{15}(1-p)$ | 0.000% | 0.000% | |
| 14 | $_{16}C_{14} \cdot p^{14}(1-p)^2$ | 0.000% | 0.000% | |
| 13 | $_{16}C_{13} \cdot p^{13}(1-p)^3$ | 0.000% | 0.000% | |
| 12 | $_{16}C_{12} \cdot p^{12}(1-p)^4$ | 0.000% | 0.000% | |
| 11 | $_{16}C_{11} \cdot p^{11}(1-p)^5$ | 0.000% | 0.000% | |
| 10 | $_{16}C_{10} \cdot p^{10}(1-p)^6$ | 0.000% | 0.000% | |
| 9 | $_{16}C_9 \cdot p^9(1-p)^7$ | 0.000% | 0.000% | |
| 8 | $_{16}C_8 \cdot p^8(1-p)^8$ | 0.000% | 0.000% | |
| 7 | $_{16}C_7 \cdot p^7(1-p)^9$ | 0.000% | 0.000% | |
| 6 | $_{16}C_6 \cdot p^6(1-p)^{10}$ | 0.002% | 0.002% | 222 |
| 5 | $_{16}C_5 \cdot p^5(1-p)^{11}$ | 0.027% | 0.029% | 185 |
| 4 | $_{16}C_4 \cdot p^4(1-p)^{12}$ | 0.272% | 0.301% | |
| 3 | $_{16}C_3 \cdot p^3(1-p)^{13}$ | 2.039% | 2.340% | |
| 2 | $_{16}C_2 \cdot p^2(1-p)^{14}$ | 10.636% | 12.976% | |
| 1 | $_{16}C_1 \cdot p^1(1-p)^{15}$ | 34.516% | 47.492% | |
| 0 | $(1-p)^{16}$ | 52.508% | 100.000% | |

FIG. 4

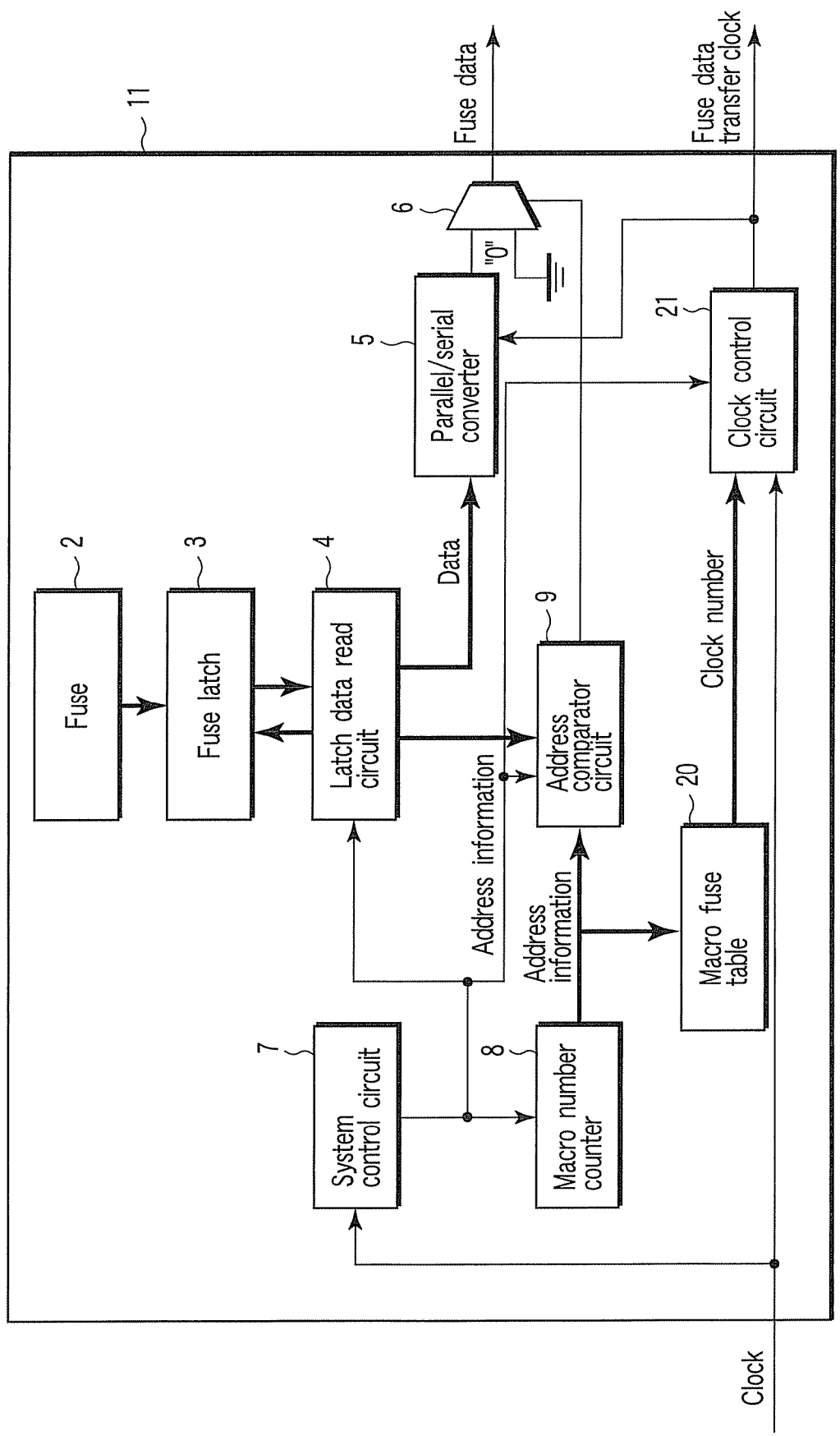
F I G. 5

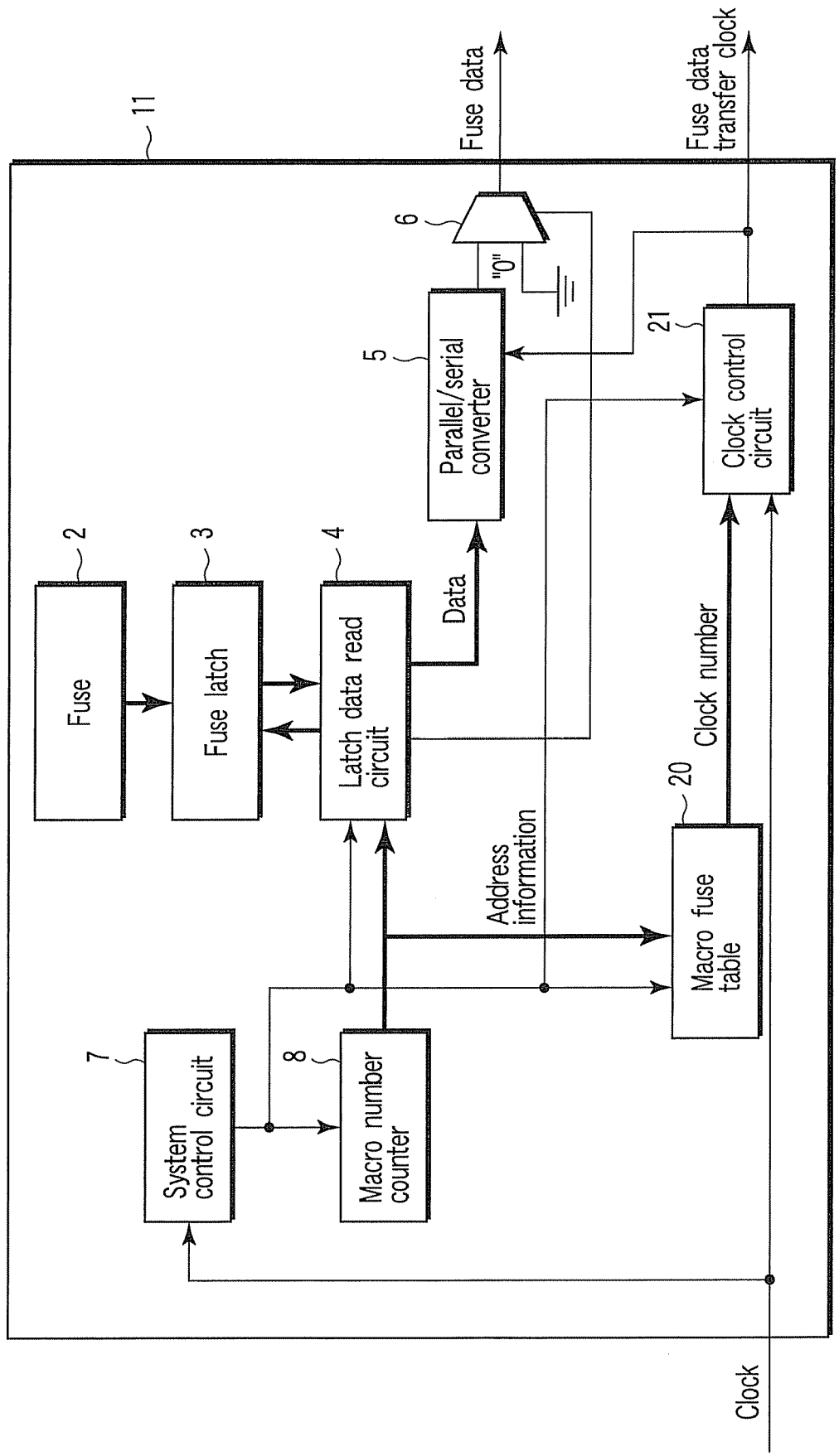
F I G. 6

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2006-010082, filed Jan. 18, 2006, the entire contents of which are incorporated herein by reference.

BACKGROUND OF THE INVENTION

1. Field of the Invention

The present invention relates to a semiconductor integrated circuit device (LSI). In particular, the present invention relates to a fuse box, which transfers redundancy address data to a memory macro from the outside of memory macro. For example, the present invention is applicable to a memory embedded LSI chip embedding a logic circuit and a memory circuit.

2. Description of the Related Art

Recently, a number of memory macros with redundancy are provided in a memory embedded LSI chip, and redundancy address data is transferred to the memory macros using a fuse box outside the memory macros.

A memory using such a fuse box is disclosed in a document titled "Shared fuse macro for multiple embedded memory device with redundancy", Proceedings of IEEE 2001 custom Integrated circuits conference, pp. 191-194, 2002. According to the document, the sequence of data "0" or "1" is compressed to reduce the number of fuses. Moreover, according to Jpn. Pat. Appln. Publication No. 2004-133970, the use of the fuse box is further generalized. However, in the technique disclosed in the former document, once the fuse is disconnected, redundancy data is not added. Furthermore, the number of bits of the redundancy data is fixed every memory macro. On the other hand, in the technique disclosed in the latter document, control is complicated, and it becomes complicated to create fuse data. In addition, in either of the techniques, a fuse data length is different depending on the position of the memory macro in which defect occurs.

BRIEF SUMMARY OF THE INVENTION

According to an aspect of the present invention, there is provided a semiconductor integrated circuit comprising:

a plurality of memory macros each including a redundancy cell, each of the memory macros being assigned with an address and transferred with data of a defect address of a semiconductor memory and store the data of the defect address;

a plurality of non-volatile memory elements less in number than the plurality of memory macros, each of which stores redundancy data to be transferred to a memory macro and address data showing the memory macro as a transfer destination of the redundancy data in a form of set; and a transfer control circuit which transfers the redundancy data to the memory macro as the transfer destination from the non-volatile memory elements in accordance with the address data showing the memory macro as the transfer destination.

BRIEF DESCRIPTION OF THE SEVERAL VIEWS OF THE DRAWING

FIGS. 3A, 3B, 3C and 3D are schematic views to explain data storage and transfer operation in the memory macros and the fuse box shown in FIG. 1;

FIG. 4 is a table showing the calculation result of redundant efficiency in the memory macros and the fuse box shown in FIG. 1;

FIG. 5 is a block diagram showing a first configuration example of the fuse box shown in FIG. 1;

FIG. 6 is a block diagram showing a second configuration example of the fuse box shown in FIG. 1;

DETAILED DESCRIPTION OF THE INVENTION

Figure 1:
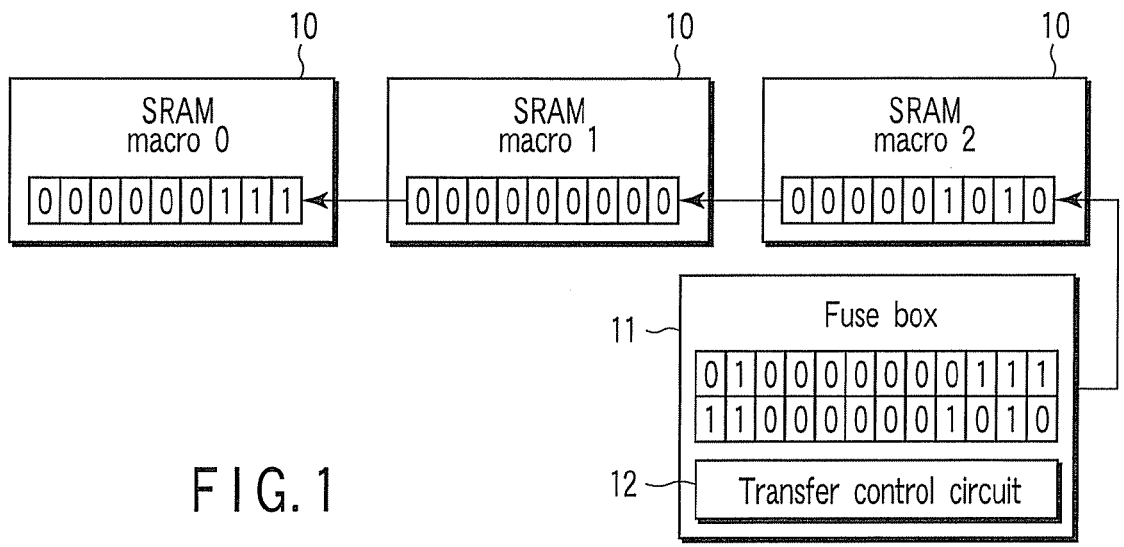
FIG. 1 is a plan view schematically showing memory macros and a fuse box formed in a memory embedded LSI chip of a semiconductor integrated circuit device according to a first embodiment of the present invention.

Embodiments of the present invention will be described hereinafter with reference to the accompanying drawings. In the following description, the same reference numerals are used to designate portions common to over the drawings.

First Embodiment

FIG. 1 is a plan view schematically showing memory macros and a fuse box formed in a memory embedded LSI chip of a semiconductor integrated circuit device according to a first embodiment of the present invention. In the LSI chip, memory macros 10 in an SRAM (static random access memory) are connected in series to a fuse box 11 storing redundancy data of part of the memory macros 10. The fuse box comprises a transfer control circuit 12. Under the control of transfer control circuit 12, in accordance with the address data stored in the fuse box, the redundancy data is transferred to the corresponding memory macro 10. In the first embodiment shown in FIG. 1, three memory macros 0, 1 and 2 are typically shown as part of 16 memory macros. Also, in the first embodiment shown in FIG. 1, the fuse box 11 has two non-volatile memory elements (fuse arrays) less than in number three memory macros 0, 1 and 2. Each of the fuse arrays is made of a plurality of fuse elements.

Each of the memory macros 0, 1 and 2 comprises shift registers. When the redundancy data showing an address of defect cell in a memory cell array of the SRAM is transferred to the memory macros, the shift registers function as fuse latches for storing the redundancy data.

The fuse box 11 comprises two fuse arrays. Each of the fuse arrays is written and stored with fuse data including a redundancy data to be transferred to a desired memory macro.

Figure 2:
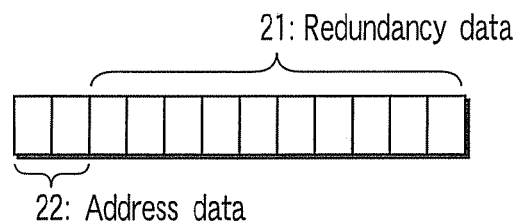
FIG. 2 is a view showing an example of a fuse data format stored in the fuse box shown in FIG. 1.

FIG. 2 is a view showing an example of a fuse data format stored in each fuse array of the fuse box 11 shown in FIG. 1. As shown in FIG. 2, the fuse data stored in each fuse array includes redundancy data 21 to be transferred to a memory macro and address data (e.g., 2 bits) 22 showing the transfer destination (memory macro ID) of the redundancy data. According to the first embodiment, a number on which "1" is added to the display number of each of the memory macros 0, 1 and 2, is used as the address data.

FIGS. 3A to FIG. 3D are schematic views to explain data storage and transfer operation in the memory macro and the fuse box shown in FIG. 1. Now, let it be assumed that memory macros 0 and 2 require redundancy while the memory macro 1 does not require redundancy. Also, let it be assumed that the first-stage fuse array uses all of 12 bits and stores 12-bit redundancy data, on the other hand, the second-stage fuse array does not use two bits and stores 10-bit redundancy data. Each fuse array of the fuse box 11 can store the maximum number of redundancy data bits (i.e., 12 bits in this embodiment).

As shown in FIG. 3A, in the initial state, the first-stage fuse array of the fuse box 11 is stored with data "01" (=memory macro ID+1) corresponding to the memory macro ID of the memory macro 0 given as transfer address data and 12 bit redundancy data. The second-stage fuse array of the fuse box 11 is stored with data "11" (=memory macro ID+1) corresponding to the memory macro ID of the memory macro 2 given as transfer address data and 10 bit redundancy data.

(1) At first, search is made whether or not the transfer destination address data corresponding to the memory macro 0 exists in the fuse box 11. Since the transfer destination address data corresponding to the memory macro 0 exists in the fuse box 11, 12-bit redundancy data corresponding to the memory macro 0 is transferred from the fuse box 11, as seen from FIG. 3B, using 12 clocks equal in number to 12 fuse latches of the memory macro 0.

(2) Search is made whether or not the transfer destination address data corresponding to the memory macro 1 exists in the fuse box 11. Since no transfer destination address data corresponding to the memory macro 1 exists in the fuse box 11 (i.e., memory macro 1 requires no redundancy), the fuse box 11 outputs 11 "0" as the redundancy data, as shown in FIG. 3C, using 11 clocks equal in number to 11 fuse latches of the memory macro 1 so that 11-bit "0" is transferred.

(3) Finally, search is made whether or not the transfer destination address data corresponding to the memory macro 2 exists in the fuse box 11. Since the transfer destination address data corresponding to the memory macro 2 exists in the fuse box 11, the fuse box 11 transfers 10-bit redundancy data corresponding to the memory macro 2, as depicted in FIG. 3D, using clocks equal in number to 10 fuse latches of the memory macro 2.

According to the operation as described, the fuse box 11 requires data corresponding to the numbers of fuse latches of memory 0 to 2. These data are determined at the design stage for connecting shift registers forming each fuse latch, and stored in the fuse box 11 as design information.

In the foregoing description, two of three memory macros are stored with redundancy data. In general, some redundancy data must be stored in order to reduce the number of fuses without giving an influence to the yield. The number of redundancy data is calculated in the following manner.

When an average defect ratio of all memory macros is set as P, a probability that m memory macros of n memory macros are defect is expressed from the following equation (1).

$$_nC_m \cdot p^m \cdot (1-p)^{(n-m)} \quad (1)$$

Thus, the probability that m memory macros or more are defective is the total sum from m to n of the foregoing equation (1).

A redundant efficiency must be considered. Here, the redundant efficiency is calculated from the yield data of 31-lot memories each having 16 memory macros having the same capacity.

All bit pass ratio of non-defective: 52.51%

When a defective ratio per memory macro is set as p, $$(1-p)^{16} = 0.5251$$

$$(1-p) = 0.9605$$

$$p = 0.03946$$

The probability that n memory macros of 16 memory macros are defective is obtained from the following expression.

$$_{16}C_m p^m (1-p)^{16-n}$$

When calculations from n=0 to n=16 are made, the result shown in FIG. 4, that is, table is obtained.

FIG. 4 shows a calculation example of the case where p=0.04 and n=16 are given in the foregoing equation (1). According to the calculation example, the accumulated probability by m=7 is 0.000%. In this case, the number of fuses is reduced without giving an influence to the yield by configuring a fuse box capable of storing redundancy data of 6 memory macros. In other words, when memory macro redundancy is limited to 6 memory macros, the yield loss is approximately 0%, and the number of fuses is reduced to 222. Moreover, since the number of storing redundancy data is readily changeable in the design stage, the storing redundancy data is initially set much, and then, the number of finally unnecessary redundancy data may be reduced. Furthermore, even in memory macros having each different capacity, the number of storable redundancy data is readily calculated from the defect probability of each memory macro. In a system in which all of fuses are provided in each of the memory macros, 512 fuses are required.

First Configuration Example of the First Embodiment

FIG. 5 is a block diagram showing a first configuration of the fuse box shown in FIG. 1. FIG. 5 shows the fuse box of the case where it is impossible to add fuse data. In FIG. 5, a reference numeral 2 denotes a fuse, 3 denotes a fuse latch, and 4 denotes a latch data read circuit for reading data latched by the fuse latch 3. A reference numeral 5 denotes a parallel/serial converter for converting an output from the latch data read circuit 4 in parallel/serial. A reference numeral 6 denotes a de-multiplexer, 7 denotes a control circuit, and 8 denotes a memory macro number counter. A reference numeral 9 denotes an address comparator circuit, 20 denotes a memory macro fuse table, and 21 denotes a clock control circuit.

The fuse box 11 is supplied with a clock from the outside, and then, outputs fuse data and fuse data transfer clock. Data stored in the fuse 2 is stored in the fuse latch 3. The memory macro number counter 8 holds a memory macro number outputting the fuse data at the present. The latch data read circuit 4 reads out data latched by the fuse latch. The parallel/serial converter 5 converts an output from the latch data read circuit 4 in parallel/serial. The address comparator circuit 9 compares first address information from the latch data read circuit 4 with second address information outputted from the memory macro number counter 8. If the comparison result coincides, the de-multiplexer 6 selects and outputs the fuse data from the parallel/serial converter 5. If the comparison result does not coincide, the de-multiplexer 6 selects and outputs data "0". The system control circuit 7 is supplied with a clock from the outside, and supplies control signals to the desired circuits to control the operation of the circuits.

The memory macro fuse table 20 is stored with the number of fuses every memory macro. The table 20 is supplied with memory macro number information (i.e., second address information) from the memory macro number counter 8, and outputs to the clock control circuit 21 clock number information required for the transfer of the fuse data currently being transferred. Then, the clock control circuit 21 generates the necessary number of fuse data transfer clock based on the clock frequency information.

The latch data read circuit 4 sequentially reads data (couple of transfer address and data) latched by the fuse latch 3 under the control of the system control circuit 7. It is indispensable that data stored in the fuse 2 be arranged in ascending or descending order of the memory macros, for this reason, it is impossible to add fuse data.

Second Configuration Example of First Embodiment

FIG. 6 is a block diagram showing a second configuration example of the fuse box 11 shown in FIG. 1. FIG. 6 shows the fuse box of the case where it is possible to add fuse data. The fuse box of FIG. 6 has approximately the same configuration as FIG. 5, however, the latch data read circuit 4 has a different function. Specifically, the latch data read circuit 4 scans whether or not a fuse array (couple of transfer address and data) having transfer address corresponding to a memory macro number data outputted from the memory macro number counter 8 exists. If such a fuse array exists, the latch data read circuit 4 outputs the fuse data under the control of the control circuit 7. The circuit 4 further controls the de-multiplexer 6 so that the de-multiplexer 6 outputs the fuse data. On the other hand, if no such a fuse array exists, the circuit 4 controls the de-multiplexer 6 so that the de-multiplexer 6 outputs data "0".

Address data (memory macro number data) outputted from the memory macro number counter 8 is inputted to the fuse latch read circuit 4. By doing so, if the coincided data exists, the de-multiplexer 6 selects and outputs the fuse data from the parallel/serial converter 5. If no coincided data exists, the de-multiplexer 6 selects and outputs data "0".

With the fuse box having the foregoing configuration, for the data stored in the fuse 2, memory macro sequence may be arbitrary, therefore, it is possible to add fuse data.

Second Embodiment

Figure 7:
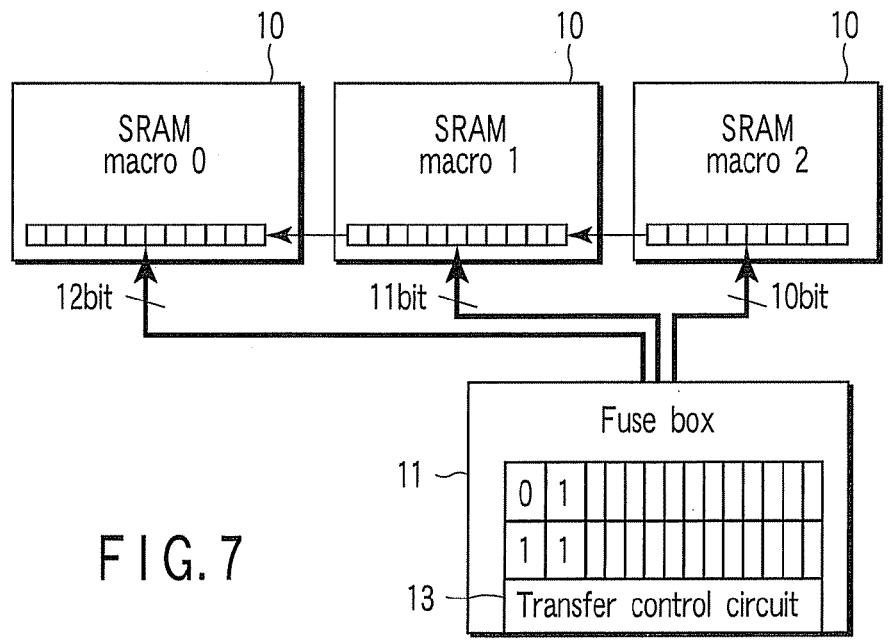
FIG. 7 is a plan view schematically showing memory macros and a fuse box formed in a memory embedded LSI chip of a semiconductor integrated circuit device according to a second embodiment of the present invention.

FIG. 7 is a plan view schematically showing memory macros and a fuse box formed in a memory embedded LSI chip of a semiconductor integrated circuit device according to a second embodiment of the present invention. The second embodiment differs from the foregoing first embodiment in that the fuse box 11 is connected in parallel with memory macros 10, and a transfer control circuit 13 provided in the fuse box 11 transfers data to each memory macro in parallel from the fuse box.

According to the second embodiment, three registers (fuse latch) storing redundancy data are provided as memory macros 10, and connected in parallel with the fuse box 11.

According to the second embodiment, data are transferred in parallel although in the first embodiment data is serially transferred. Specifically, search is made with regard to a memory macro ID, and if the memory macro corresponding to the memory macro ID exists, fuse data is transferred to the memory macro. If no corresponding memory macro exists, no transfer of the fuse data is carried out, or data "0" is transferred.

FIGS. 8A to FIG. 8D are schematic views to explain data storage and transfer operation in the fuse box having the configuration shown in FIG. 7. Now, let it be assumed that the memory macros 0 and 2 require redundancy while the memory macro 1 does not require redundancy. Each fuse array stores the maximum number of redundancy data bits (12 bits in this embodiment). Also, let it be assumed that the first-stage fuse array uses all of 12-bits and stores 12-bit redundancy data. On the other hand, the second-stage fuse array does not use two bits and stores 10-bit redundancy data. Each fuse array of the fuse box 11 can store the maximum number of redundancy data bits (i.e., 12 bits also in this embodiment).

Figure 8A:
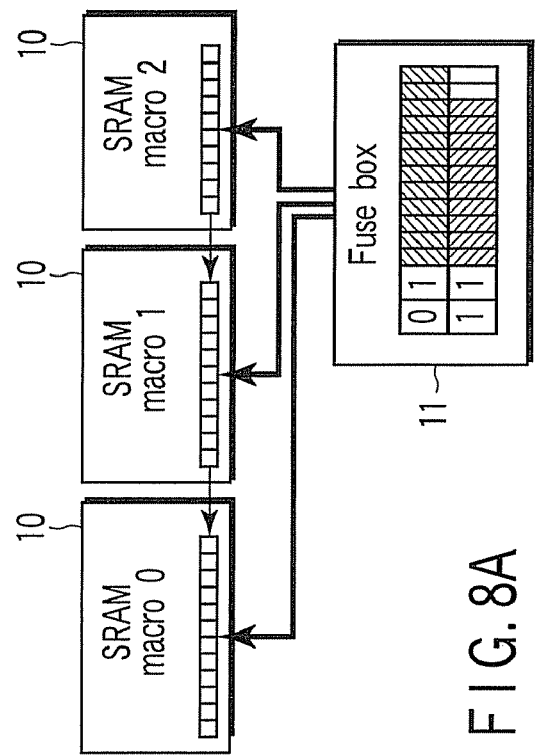
FIGS. 8A, 8B, 8C and 8D are schematic views to explain data storage and transfer operation in the memory macros and the fuse box shown in FIG. 7.
Figure 8B:
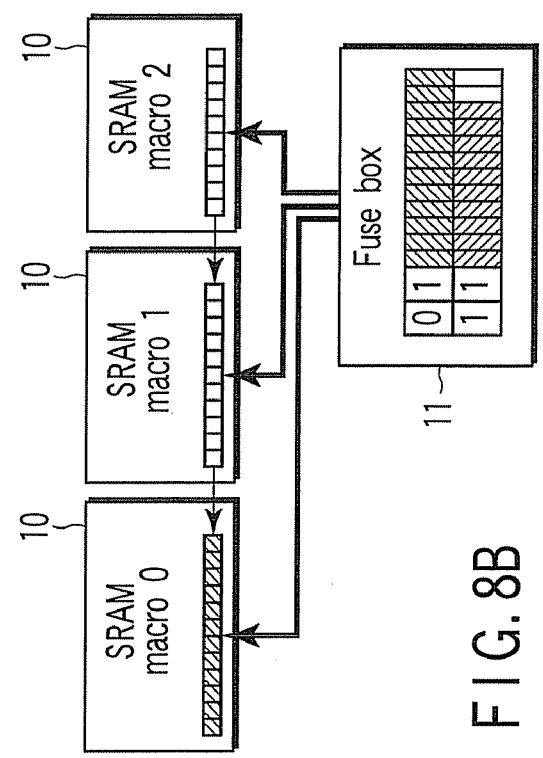

As shown in FIG. 8A, in the initial state, the first-stage fuse array of the fuse box 11 is stored with data "01" (=memory macro ID+1) corresponding to the memory macro ID of the memory macro 0 given as transfer address data and 12 bit redundancy data. The second-stage fuse array is stored with data "11" (=memory macro ID+1) corresponding to the memory macro ID of the memory macro 2 given as transfer address data and 10 bit redundancy data.

(1) At first, search is made whether or not the transfer destination address data corresponding to the memory macro 0 exists in the fuse box 11. Since the transfer destination address data corresponding to the memory macro 0 exists in the fuse box 11, 12-bit redundancy data corresponding to the memory macro 0 is transferred in correspondence in number to 12 fuse latches of the memory macro 0, as seen from FIG. 8B.

Figure 8C:
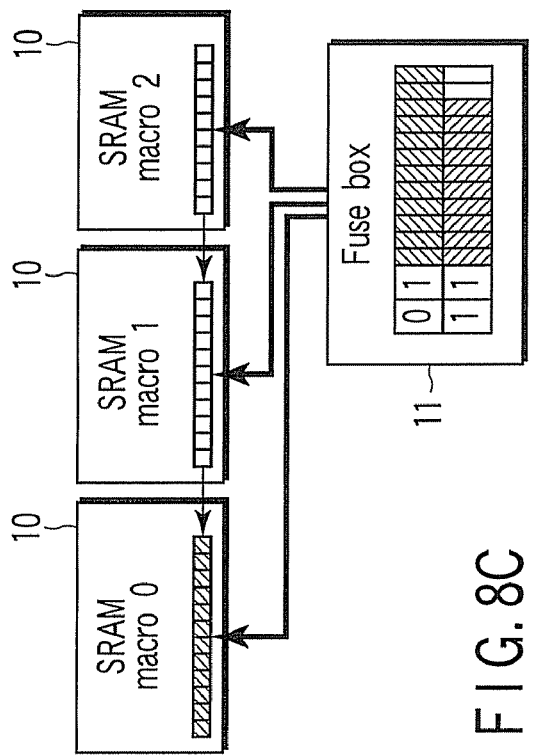

(2) Search is made whether or not the transfer destination address data corresponding to the memory macro 1 exists in the fuse box 11. Since no transfer destination address data corresponding to the memory macro 1 exists in the fuse box 11 (i.e., memory macro 1 requires no redundancy), the fuse box 11 outputs 11 "0" as the redundancy data in correspondence in number to 11 fuse latches of the memory macro 1, as shown in FIG. 8C, so that 11-bit "0" is transferred.

Figure 8D:
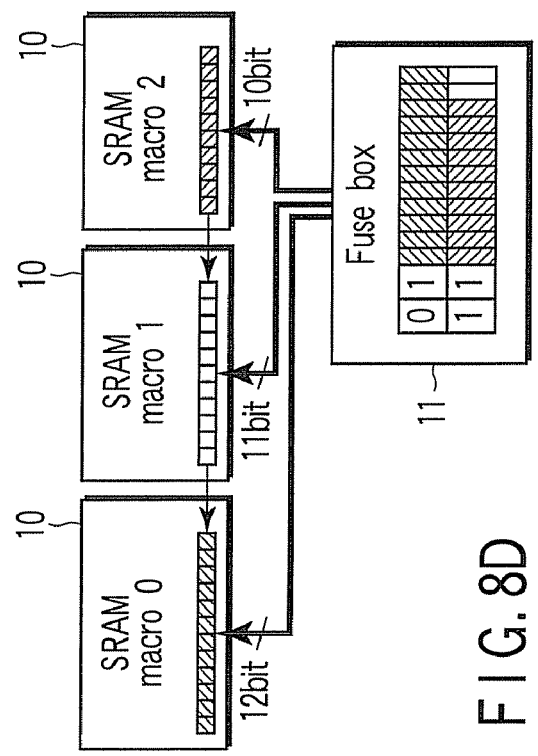

(3) Finally, search is made whether or not the transfer destination address data corresponding to the memory macro 2 exists in the fuse box 11. Since the transfer destination address data corresponding to the memory macro 2 exists in the fuse box 11, the fuse box 11 transfers 10-bit redundancy data corresponding to the memory macro 2, as depicted in FIG. 8D, in correspondence in number to 10 fuse latches of the memory macro 2.

The foregoing second embodiment is adaptable to the case where the number of memory macros is reduced, and the increase of the number of interconnections (interconnection regions) between the memory macros and the fuse box is considered less. Data transfer is carried out from the fuse box to each memory macro 10 at high speed, therefore, initialization setup time is shortened.

Third Embodiment

Figure 9:
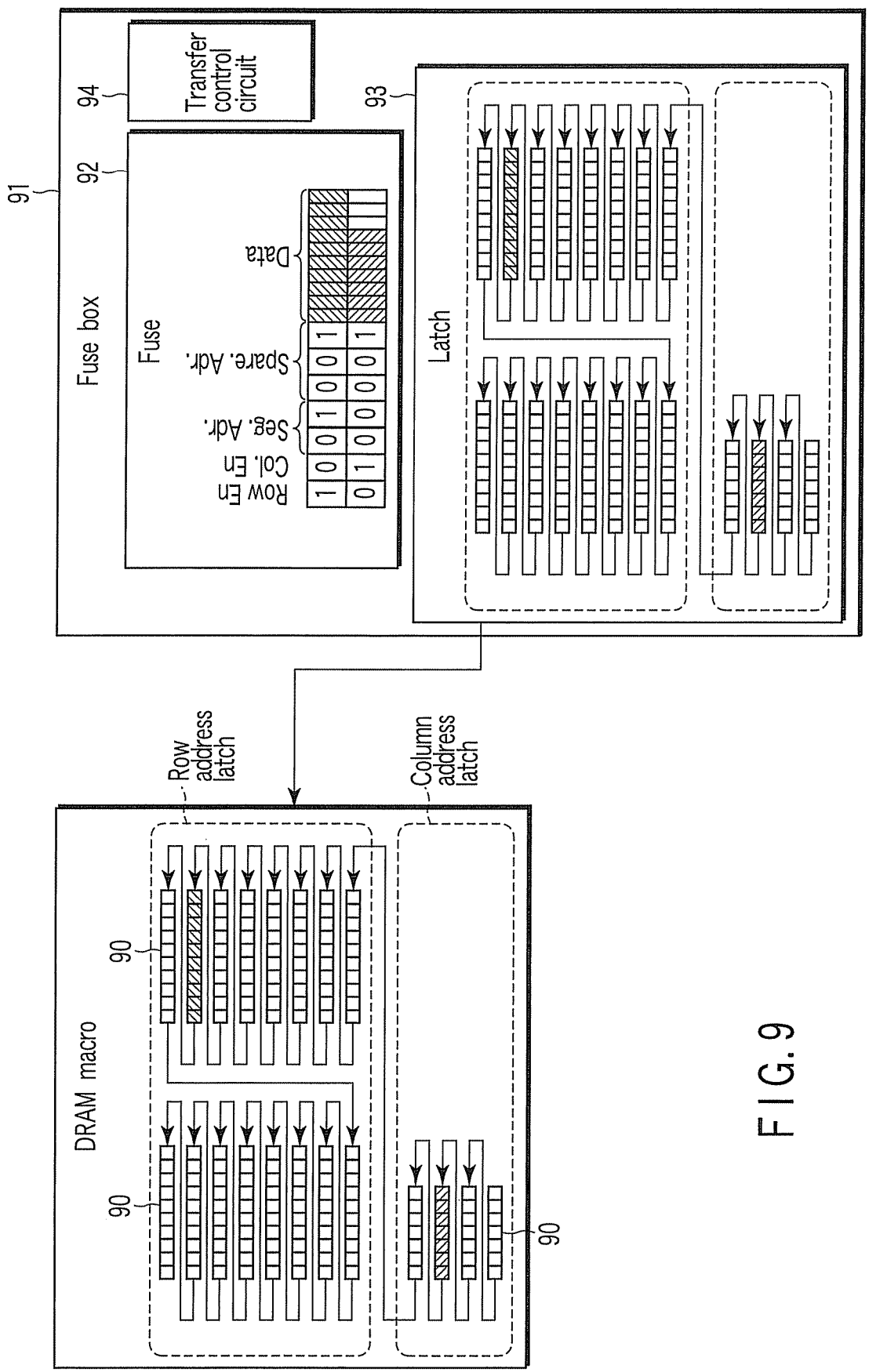
FIG. 9 is a plan view schematically showing memory macros and a fuse box formed in a memory embedded LSI chip of a semiconductor integrated circuit device according to a third embodiment of the present invention.

FIG. 9 is a plan view schematically showing memory macros and a fuse box formed in a memory embedded LSI chip of a semiconductor integrated circuit device according to a third embodiment of the present invention. The third embodiment is applicable to fuse latch having a complicated structure such as DRAM memory macro.

Redundancy latches 90 (i.e., latch circuits storing row and column address in DRAM memory macro) in a DRAM (dynamic random access memory) are serial-connected. Each of the redundancy latches 90 comprises a first fuse latch formed of a shift register. Redundancy data showing defect address (row and column address) in a DRAM memory cell array is transferred to the redundancy latches 90 and stored in the first fuse latches.

A fuse box 91 comprises fuse 92, latch 93 and transfer control circuit 94. The fuse 92 stores redundancy data less in number than the redundancy latches 90. The latch 93 comprises second fuse latches equal in number to the first fuse latches and similar in figuration to the first fuse latches.

The second fuse latches of the latch 93 are serial-connected. Each of the second fuse latches is assigned an address and stores the corresponding defect address data transferred from the fuse 92. The output side of the second fuse latch is connected in series with the first fuse latches.

The fuse arrays of the fuse 92 are written and stored with fuse data having the following information via the latch 93. One is redundancy data DATA to be transferred to a desired first fuse latch. Another is address data (segment address Seg. adr., spare address Spare. Adr., row enable Row En, and column enable col. En) showing address of the transfer redundancy latch address corresponding to the redundancy data. The redundancy data DATA and the address data are written as a set in the fuse arrays of the fuse 92. In the fuse box 91, the array area of the latch 93 is closer to the array area of fuse 92 than the DRAM macro 10.

The transfer control circuit 94 initializes the latch 93 using data "0" before transferring redundancy data. Thereafter, the circuit 94 transfers redundancy data paring with address data to the second fuse latch of the latch 93 stored with address data in accordance with the address data. Thereafter, the circuit 94 serially transfers storage data of the second fuse latches to the first fuse latches (redundancy latches 90).

As described above, in the third embodiment, the fuse box 91 has the latch 93 which includes fuse latches serially connected like the fuse latches of the redundancy latch 90, and assigned with address corresponding to the transfer destination of fuse data. Thus, according to the transfer destination of the fuse data, redundancy data is readily stored in the fuse latch of the fuse box 91 at high speed. When the redundancy data is all stored, it is serially transferred to the fuse latch of the redundancy latch 90. The latch 93 of the fuse box 91 is arrayed near the fuse 92, therefore, the area for making a connection between the latch 93 and the fuse 92 is small. On the contrary, if the distance between the redundancy latch 90 and the fuse 92 of the fuse box 91 is long, the interconnection area for making a connection between the both becomes long. However, serial interconnection is given, therefore, the interconnection area is small.

Therefore, according to the third embodiment, even if redundancy data is transferred to memory macros having complicated redundancy configuration such as DRAM macro, the number of fuses is reduced.

According to the third embodiment, the fuse box is applied to one DRAM macro. Like the first embodiment, transfer memory macro address is added, and thereby, the fuse box is applicable to a plurality of memory macros.

Configuration Example of the Third Embodiment

Figure 10:
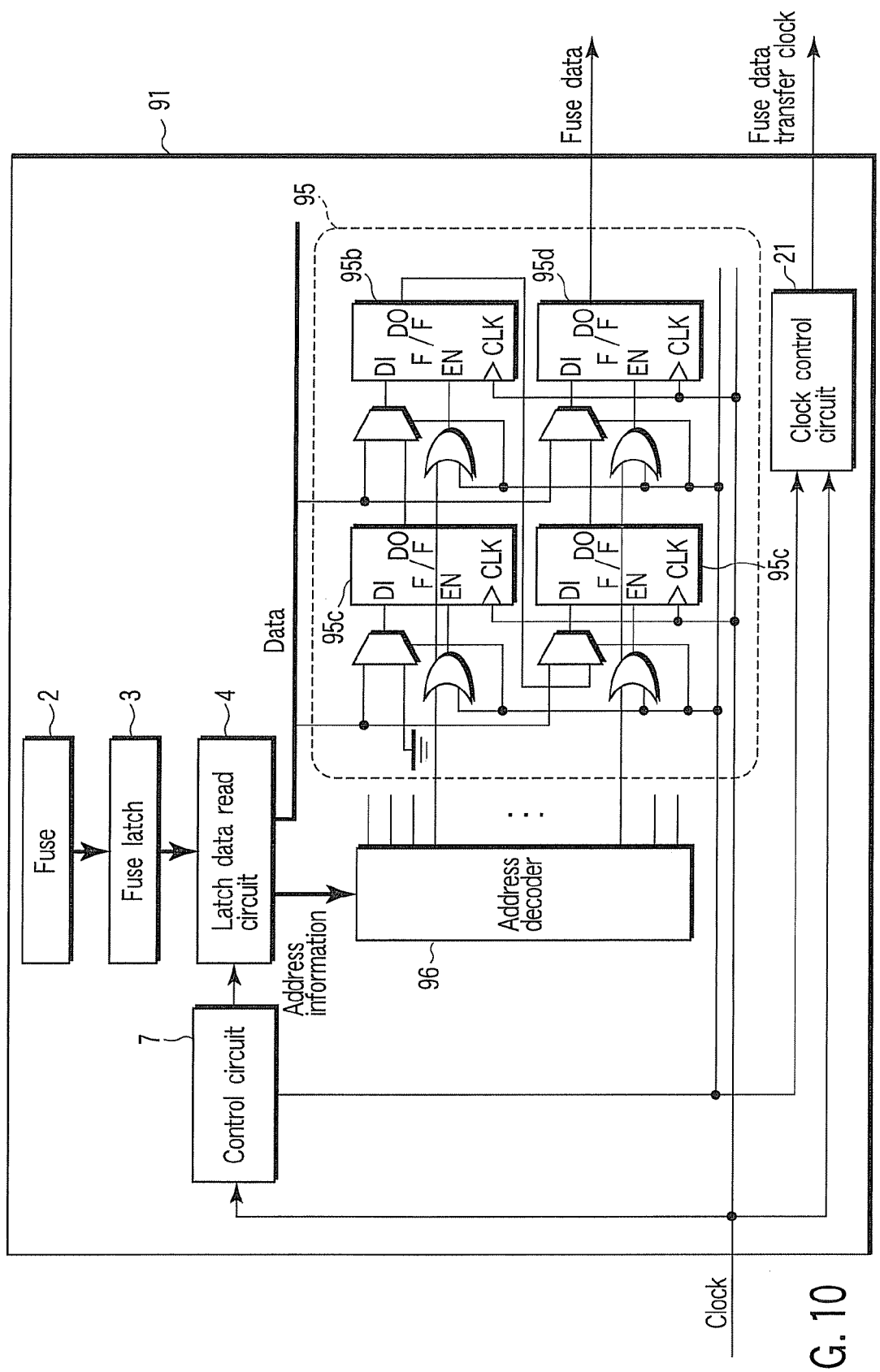
FIG. 10 is a block diagram showing a configuration example of the fuse box shown in FIG. 9.

FIG. 10 is a block diagram showing the configuration example of the fuse box 91 shown in FIG. 9. In the fuse box of this example, it is possible to add fuse data.

In FIG. 10, a reference numeral 2 denotes a fuse, 3 denotes a fuse latch, 4 denotes fuse latch read circuit, 95 denotes a flip-flop circuit group, 96 denotes an address decoder, 7 denotes a control circuit and 21 denotes a clock control circuit.

In the flip-flop circuit group of FIG. 10, there are shown four flip-flop circuits 95a to 95d only. In fact, the flip-flop circuit exists by the number of fuse data, that is, the number of fuse data bits in the horizontal direction and by the number of addresses in the vertical direction. These flip-flop circuits constitute a shift register, and input data in parallel when the corresponding address becomes valid and execute a shift operation when a shift mode is selected by the control circuit 7.

All flip-flop circuits of the flip-flop circuit group 95 are connected to execute data shift. For initialization, the input of the first-stage flip-flop circuit 95a is set to "0". Moreover, all flip-flop circuits store data based on address data, and thereafter, intactly outputs fuse data in a shift mode. By doing so, all flip-flop circuits are connected so that the fuse data is transferred to the corresponding memory macro. In other words, the address of the flip-flop circuit corresponds to the sequence of the shift mode.

The fuse box 91 is supplied with a clock from the outside, and outputs fuse data and fuse data transfer clock.

Before the read circuit reads fuse data, the mode is changed into a shift mode for a clock frequency when all flip-flop circuits becomes "0".

Data stored in the fuse is stored in the fuse latch 3. The fuse latch read circuit 4 sequentially reads out fuse data (i.e., couple of transfer destination address and data). The address decoder 6 decodes the transfer destination address, and the fuse data is stored in parallel in the corresponding flip-flop circuit group. All fuse data (i.e., couple of transfer destination address and data) are stored in the flip-flop circuit group, and thereafter, the mode is changed into a shift mode to output data as fuse data. The clock control circuit 21 generates a fuse transfer clock only when the shift mode is set. The control circuit 7 is supplied with a clock from the outside, and supplies control signals to desired circuits to controls operation of the circuits.

The fuse latch read circuit 4 sequentially reads out fuse data (i.e., couple of transfer destination address and data) under the control of the control circuit 7. Addition of fuse data to be stored in the fuse is possible.

As described above, in the above described embodiments, a memory embedded LSI chip is configured to transfer redundancy address data from a fuse box outside memory macros. Data stored in a fuse is divided into two, that is, an area storing address data (e.g., memory macro ID information) to be transferred, and an area storing redundancy data. By doing so, the number of memory macros capable of executing redundancy is limited, thereby reducing the number of fuses. Accordingly, only memory macro data actually requiring redundancy data is stored in the fuse. By doing so, the number of fuses is reduced. According to the configuration described above, the fuse is made an off state, and thereafter, redundancy data is readily added. Moreover, the number of redundancy data bits for each memory macro is variable. The fuse data length depends on the number of defective memory macros only. Therefore, the fuse data length has no change depending on the position of the memory macro where defect occurs. As a result, large merits are obtained in actual operations and maintenance.

Various kinds, that is, optical fuse cut by laser beam, electric fuse electrically disconnected or connected, are given as a fuse element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a plurality of memory macros each including a redundancy cell, each of the memory macros being assigned with an address and transferred with data of a defect address of a semiconductor memory and store the data of the defect address;
   a plurality of non-volatile memory elements less in number than the plurality of memory macros, each of which stores redundancy data to be transferred to a memory macro and address data showing the memory macro as a transfer destination of the redundancy data in a form of set; and
   a transfer control circuit which transfers the redundancy data to the memory macro as the transfer destination from the non-volatile memory elements in accordance with the address data showing the memory macro as the transfer destination.

2. The semiconductor integrated circuit according to claim 1, wherein the memory macros have latch circuits to which the data of the defect address is serially transferred,
   the transfer control circuit serially transfers, to a latch circuit whose address data is stored in the non-volatile memory elements, data equivalent to clocks required for storing the redundancy data in a form of set with the address data, and serially transfers, to a latch circuit whose address data is not stored in the non-volatile memory elements, "0" data equivalent to clocks required for storing data in the latch circuit.

3. The semiconductor integrated circuit according to claim 1, wherein the memory macros have latch circuits to which the data of the defect address is transferred in parallel,
   the transfer control circuit transfers in parallel, to a latch circuit whose address data is stored in the non-volatile memory elements, data equivalent to clocks required for storing the redundancy data in a form of set with the address data, and transfers in parallel, to a latch circuit whose address data is not stored in the non-volatile memory elements, "0" data equivalent to clocks required for storing data in the latch circuit.

4. The semiconductor integrated circuit according to claim 1, wherein the semiconductor integrated circuit is a memory embedded semiconductor chip.

5. The semiconductor integrated circuit according to claim 1, wherein the memory macros comprise SRAM memory macros.

6. The semiconductor integrated circuit according to claim 1, wherein the latch circuit of each of the memory macros comprises a shift register.

7. The semiconductor integrated circuit according to claim 1, wherein each of the non-volatile memory elements comprises a fuse array made of a plurality of fuses.

8. The semiconductor integrated circuit according to claim 1, wherein the transfer control circuit comprises data latch circuits for latching data stored in the non-volatile memory elements, a latch data read circuit for reading data latched by the data latch circuits, a parallel/serial converter circuit for converting an output from the latch data read circuits in parallel/serial, a de-multiplexer circuit for selectively outputting a converted data from the parallel/serial converter circuit, a control circuit which is supplied with a clock from the outside and supplies control signals to the desired circuits to control the operation of the circuits, a memory macro number counter circuit for holding the number of a memory macro to which data is being transferred, an address comparator circuit for comparing an output of the latch data read circuit converted in parallel/serial by the parallel/serial converter circuit with an output of the memory macro number counter, a memory macro bit table storing the number of bits every memory macros, and a clock control circuit for generating a data transferring clock.

9. The semiconductor integrated circuit according to claim 8, wherein when a comparison result of the address data by the address comparator circuit shows that the address data coincide with each other, the de-multiplexer selects and outputs the output data of the parallel/serial converter circuit, and when a comparison result of the address data by the address comparator circuit shows that the address data do not coincide with each other, the de-multiplexer outputs "0" data.

10. The semiconductor integrated circuit according to claim 8, wherein the clock control circuit generates a necessary number of the data transferring clock based on the number of bits stored in the memory macro bit table.

11. The semiconductor integrated circuit according to claim 1, wherein the transfer control circuit comprises data latch circuits for latching data stored in the non-volatile memory elements, a memory macro number counter circuit for holding the number of a memory macro to which data is being transferred, a latch data read circuit for scanning whether or not a data latch circuit having an address data of a memory macro as the transfer destination corresponding to the number of a memory macro outputted from the memory macro number counter exists, and for reading, when the data latch circuit exists, data stored in the data latch circuit, a parallel/serial converter circuit for converting an output from the latch data read circuit 4 in parallel/serial, a de-multiplexer circuit for selectively outputting a converted data from the parallel/serial converter circuit, a control circuit which is supplied with a clock from the outside and supplies control signals to the desired circuits to control the operation of the circuits, a memory macro bit table storing the number of bits every memory macros, and a clock control circuit for generating a data transferring clock.

12. The semiconductor integrated circuit according to claim 11, wherein when an output data of the latch data read circuit is inputted to the de-multiplexer, the de-multiplexer selects and outputs the output data of the parallel/serial converter circuit, and when no output data of the latch data read circuit is inputted to the de-multiplexer, the de-multiplexer outputs "0" data.

13. The semiconductor integrated circuit according to claim 11, wherein the clock control circuit generates a necessary number of the data transferring clock based on the number of bits stored in the memory macro bit table.

14. A semiconductor integrated circuit comprising:
   a plurality of first latch circuits which are serially transferred with data of defect address of a semiconductor memory and store the data of the defect address;
   a memory macro which includes a plurality of second latch circuits serially connected to the first latch circuits and assigned with address and having the same configuration as the first latch circuits and equal in number to the first latch circuits, the data of the defect address of the semiconductor memory being transferred to the second latch circuits and stored in the second latch circuits;
   a plurality of non-volatile memory elements less than in number the second latch circuits, and stores redundancy data to be transferred to the second latch circuits and address data showing the transfer destination of the redundancy data in a form of set;

a control circuit initializing the second latch circuits using data "0"; and a transfer control circuit which transfers in parallel, to a second latch circuit whose address data is stored in the non-volatile memory elements, redundancy data in a form of set with the address data in accordance with the address data, and thereafter serially transfers the data stored in the second latch circuits to the first latch circuits.

15. The semiconductor integrated circuit according to claim 14, wherein the memory macros comprise DRAM memory macros.

16. The semiconductor integrated circuit according to claim 14, wherein the first latch circuits are serially connected to each other.

17. The semiconductor integrated circuit according to claim 14, wherein the transfer control circuit comprises data latch circuits for latching data stored in the non-volatile memory elements, a latch data read circuit for reading data latched by the data latch circuits, an address decoder circuit for decoding an address data of the latch data read circuit, a shift register circuit constituted of a plurality of flip-flop circuits connected in such a scheme that when an decoded address data is valid, output data of the latch data read circuit are stored in parallel in the corresponding flip-flop circuits, a control circuit which is supplied with a clock from the outside and supplies control signals to the desired circuits, a clock control circuit which, after all of the data latched by the data latch circuits are stored in the flip-flop circuits, outputs a transfer clock for outputting the data stored in the flip-flop circuits.

18. A semiconductor integrated circuit comprising:

a plurality of patterns of a plurality of first latch circuits which are serially transferred with data of defect address of a semiconductor memory and store the data of the defect address;

a pattern of a memory macro which includes a plurality of second latch circuits serially connected to the first latch circuits and assigned with address and having the same configuration as the first latch circuits and equal in number to the first latch circuits, the data of the defect address of the semiconductor memory being transferred to the second latch circuits and stored in the second latch circuits;

a plurality of patterns of a plurality of non-volatile memory elements less than in number the second latch circuits, and stores redundancy data to be transferred to the second latch circuits and address data showing the transfer destination of the redundancy data in a form of set;

a pattern of a control circuit initializing the second latch circuits using data "0"; and a pattern of a transfer control circuit which transfers in parallel, to a second latch circuit whose address data is stored in the non-volatile memory elements, redundancy data in a form of set with the address data in accordance with the address data, and thereafter serially transfers the data stored in the second latch circuits to the first latch circuits.

19. The semiconductor integrated circuit according to claim 18, wherein the memory macros comprise DRAM memory macros.

20. The semiconductor integrated circuit according to claim 18, wherein the first latch circuits are serially connected to each other.

* * * * *